US007880287B1

(12) United States Patent
Samuel et al.

(10) Patent No.: US 7,880,287 B1
(45) Date of Patent: Feb. 1, 2011

(54) STUD BUMPS FOR DIE ALIGNMENT

(75) Inventors: Bruno Samuel, Apopka, FL (US); Charles Carpenter, Orlando, FL (US); John Beall, Richardson, TX (US); Justin Everman, Richardson, TX (US); Benne Velsher, Plano, TX (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 12/537,957

(22) Filed: Aug. 7, 2009

(51) Int. Cl.
*H01L 23/495* (2006.01)

(52) U.S. Cl. ............... 257/692; 257/737; 257/E23.031; 438/123

(58) Field of Classification Search ................. 257/692, 257/E23.031, E23.068, E21.506, 737; 438/123
See application file for complete search history.

(56) References Cited

U.S. PATENT DOCUMENTS 5,453,701 A * 9/1995 Jensen et al. ................ 324/755
5,895,554 A * 4/1999 Gordon ...................... 156/556
6,980,014 B2 * 12/2005 Akram et al. ............... 324/755
7,407,085 B2 8/2008 Susheel

* cited by examiner

*Primary Examiner*—Roy K Potter
(74) *Attorney, Agent, or Firm*—Schwabe Williamson & Wyatt

(57) ABSTRACT

Embodiments include but are not limited to apparatuses and systems including a package having stud bumps for die alignment. A package may include a package substrate, and a plurality of stud bumps coupled to the package substrate. The stud bumps may define a die region of the package substrate in which movement of a die disposed within the die region is restricted prior to attachment of the die to the package substrate, wherein the plurality of stud bumps comprise a profile that is less than a profile of the die when attached to the package substrate. Other embodiments may be described.

18 Claims, 4 Drawing Sheets

100
102
1B
1B
104
110
112
106
108

STUD BUMPS FOR DIE ALIGNMENT

TECHNICAL FIELD

Embodiments of the present disclosure relate generally to microelectronic devices and more particularly to microelectronic devices having a package including stud bumps for die alignment.

BACKGROUND

Microelectronic packages include one or more dies fixed to a package substrate. A die is sometimes coupled to a package substrate using solder, where solder is disposed between the die and the package substrate and then exposed to heat, to reflow the solder. Once cooled, the die is fixed by the reflown solder.

Prior to completion of the reflow process, the die is free to move around. The die may move from movement or vibration of the package during handling, or during the reflow process when the solder is in a liquid state, allowing the die to float. This movement can be problematic in that performance of some devices (e.g., radio-frequency devices) may be tied to having precise and repeatable placement of the die in the package.

To restrict the movement of the die within the package prior to completion of the reflow process, pockets are sometimes formed in the package substrate, or precision-machined alignment plates are used. Using package substrates including pockets requires stocking custom-formed package substrates for various particular devices. Although the alignment plates allow for use of generic package substrates, removal of the plates after a die is fixed to the package substrate requires additional manual steps and sometimes results in damage to the die.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present invention, are synonymous.

As used herein, "coupled," along with its derivatives, may mean one or more of the following. "Coupled" may mean a direct physical or electrical coupling or connection, wherein there is no other element coupled or connected between the elements that are said to be coupled with each other. "Coupled" may also mean an indirect physical or electrical coupling or connection, where one or more other elements are coupled or connected between the elements that are said to be coupled with each other.

The phrase "formed on," along with its derivatives, may be used herein. "Formed on" in the context of "a layer being formed on another layer" may mean that a layer is formed above, but not necessarily in direct physical or electrical contact with, another layer, e.g., there may be one or more other layers interposing the layers. In some embodiments, however, "formed on" may mean that a layer is in direct physical contact with at least a portion of a surface of another layer.

For the purposes of the present disclosure, the phrase "A/B" means A or B. The phrase "A and/or B" means (A), (B), or (A and B). The phrase "at least one of A, B, and C" means (A), (B), (C), (A and B), (A and C), (B and C), or (A, B and C). The phrase "(A)B" means (B) or (A and B), that is, A is an optional element. In addition, although embodiments of the present disclosure may be shown and described as including a particular number of components or elements, embodiments are not limited to any particular number of components or elements.

Figure 1A:
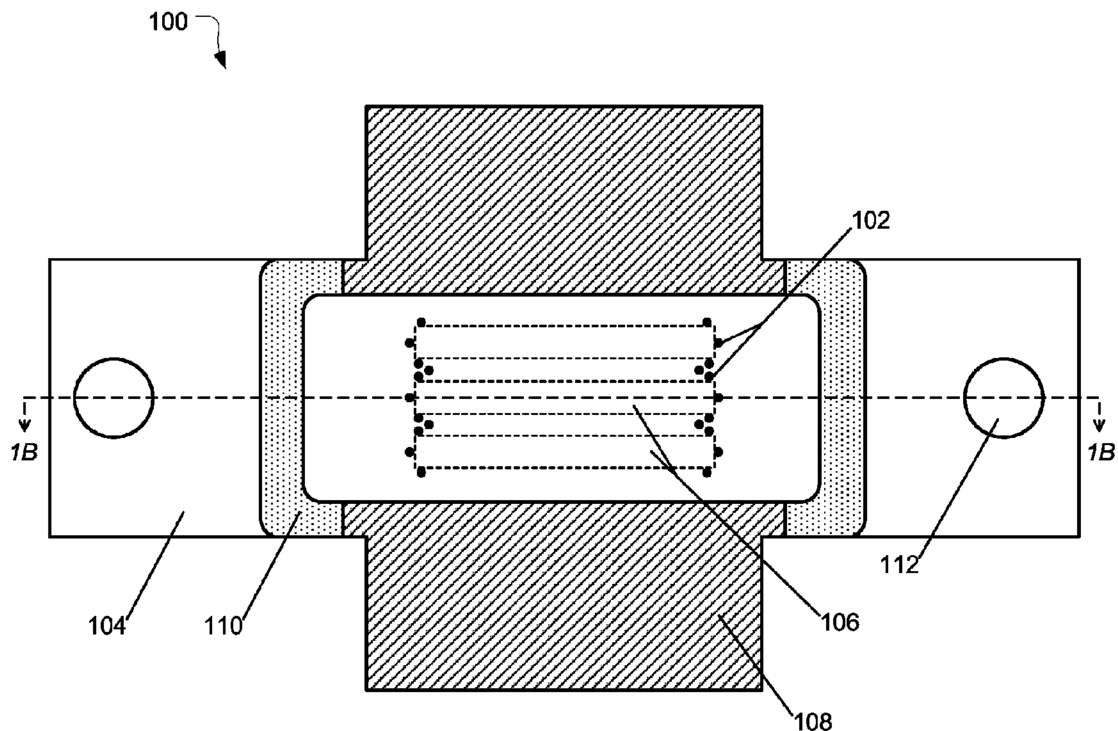
FIGS. 1A and 1B are plan and cross-sectional views, respectively, of a microelectronic package in accordance with various embodiments.
Figure 1B:
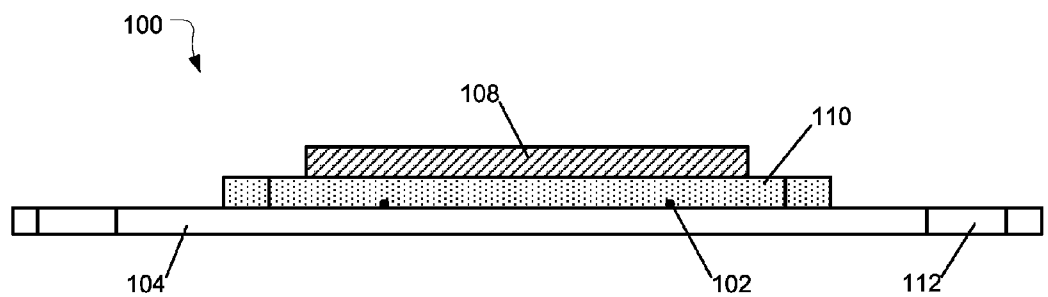

FIG. 1A illustrates a top view of an example microelectronic package 100 including a plurality of stud bumps 102 for die alignment, in accordance with various embodiments, while FIG. 1B illustrates a cross-sectional view of the package 100 taken along line 1B-1B.

The stud bumps 102 (sometimes also referred to as "ball bumps" or just "bumps") are coupled to a package substrate 104 and define die regions 106 (outlines of which are depicted by hashed lines) of the package substrate 104. The die regions 106 are locations at which one or more dies are to be coupled to the package substrate 104 for aligning the dies, as described more fully herein. It is noted that although the illustrated embodiment depicts three generally rectangular die regions 106, in various other embodiments, there may be more or fewer die regions 106, and the die regions 106 may be configured with any appropriate shape and size, generally corresponding to a shape and size of the dies to be coupled to the package substrate 104.

The stud bumps 102 may be arranged to restrict movement of a die located in a die region 106 during subsequent operation(s). Restriction of movement may be particularly advantageous for applications in which a die is coupled to the package substrate 104 by curing, reflowing, or another coupling operation wherein the die is not immediately coupled to the package substrate 104. As illustrated, each of the die regions 106 includes stud bumps 102 on all sides, and thus, this arrangement may restrict movement of a die in both x and y directions. In various embodiments, stud bumps 102 may be disposed on fewer than all sides of the die regions 106.

The stud bumps 102 may be formed using any stud bumping machine and method. An example stud-bumping operation may include melting an end of a wire of the desired stud bump 102 material to form a ball on the end of the wire. The stud-bumping machine may then bond the ball onto the package substrate 104 surface. The wire is then cut close to the ball, leaving the stud bump 102. Other methods may be similarly suitable.

The package 100 may be further configured according to conventional packages. For example, the package 100 may include a lead frame 108 coupled to the package substrate 104 by a bonding ring 110. The bonding ring 110 may also be used for coupling a lid (not illustrated) onto the package 100. The package substrate 104 may include mounting holes 112, to allow the package 100 to be bolted to a system level board. In other embodiments, the package substrate 104 may instead include no mounting holes 112, instead being coupled to a system level board by soldering or another coupling method.

The use of stud bumps 102 may allow for increased flexibility in terms of the ability to use stud bumps 102 for die registration to any existing flat package. Rather than using pre-formed pockets or precision-machined alignment plates, the use of stud bumps 102 enables the relocation of the stud bumps 102 as needed for each design, as they are not a permanent part of the packages. In other words, the application of the stud bumps 102 to the package is simply a step in the assembly of devices (e.g., just like wire bonding or reflow).

Figure 2A:
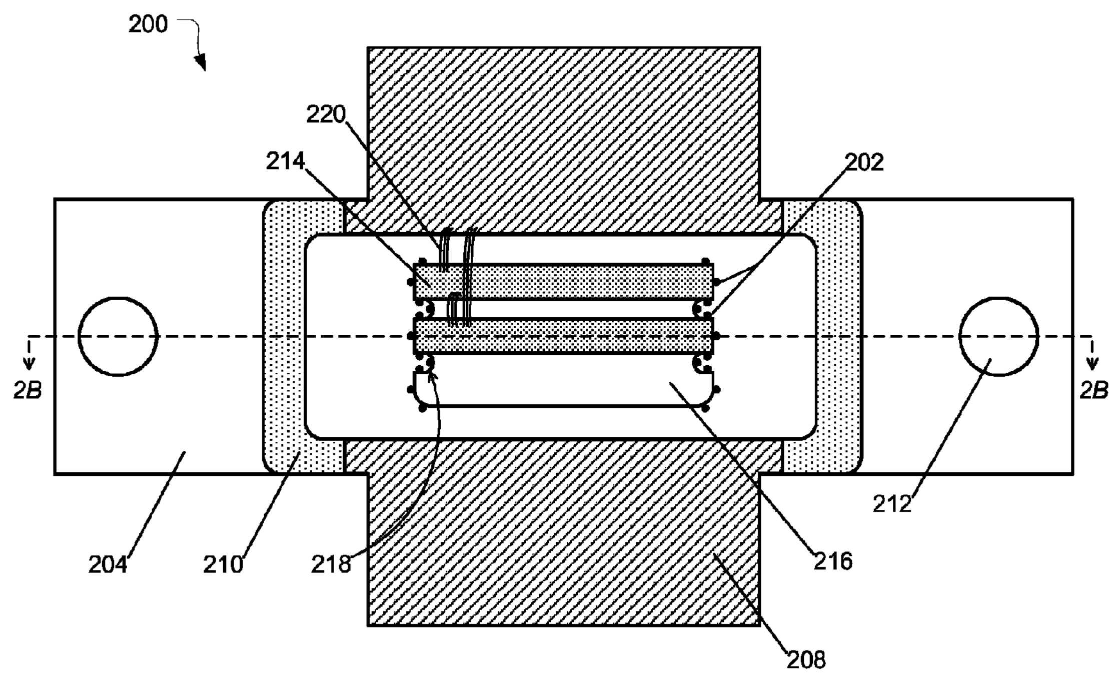
FIGS. 2A and 2B are plan and cross-sectional views, respectively, of a microelectronic package including dies in accordance with various embodiments.
Figure 2B:
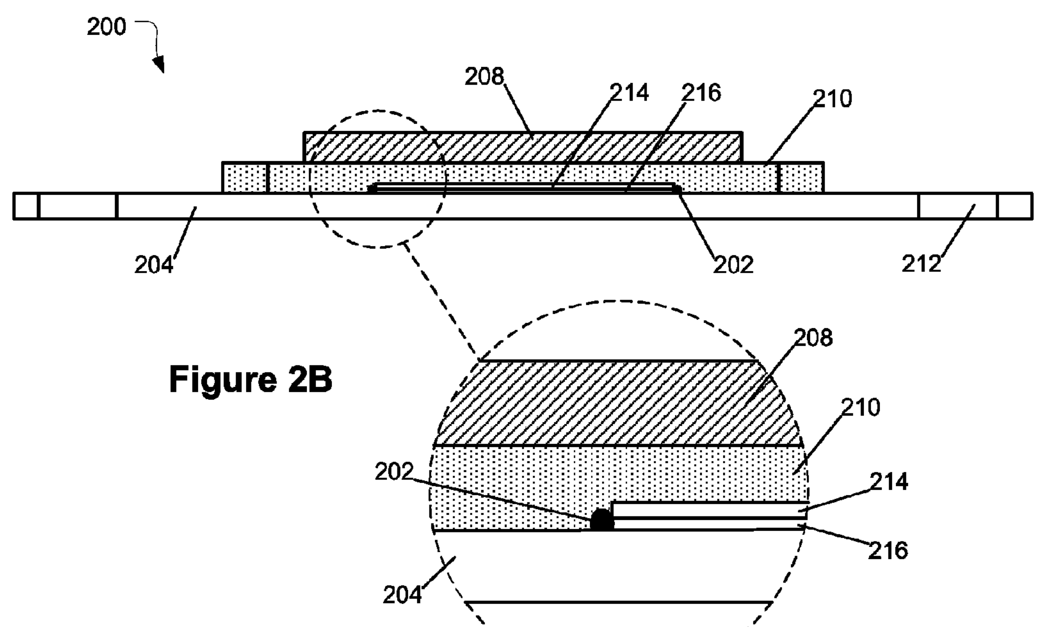

FIGS. 2A and 2B illustrate another microelectronic package 200 in accordance with various embodiments. FIG. 2A illustrates a top view of the microelectronic package 200, while FIG. 2B illustrates a cross-sectional view of the microelectronic package 200 taken along line 2B-2B. The package 200 includes some of the elements of the package 100 illustrated in FIGS. 1A-1B including, for example, a lead frame 208, a bonding ring 210, and a package substrate 204 having mounting holes 212.

As illustrated, the package 200 further includes dies 214 coupled to the package substrate 204. It is noted that although the illustrated embodiment depicts two dies 214, in various other embodiments, there may be more or fewer dies 214. Moreover, other embodiments may include the dies 214 in a stacked configuration and/or in some arrangement other than that illustrated.

The dies 214 are coupled to the package substrate 204 at locations substantially corresponding to two of the die regions (not illustrated here; see die regions 106 at FIG. 1A). As mentioned earlier, the stud bumps 202 define the die regions and may be arranged to restrict movement of a die 214 located in the defined die region. To that end, the stud bumps 202 are disposed at locations in which the stud bumps 202 bound the dies 214. In this arrangement, the dies 214 may be restricted from moving during subsequent operation(s) on the package 200.

Subsequent operation(s) on the package 200 may include operation(s) for coupling the dies 214 to the package substrate 204 such as, for example, curing, reflowing, or another operation wherein the dies 214 are not immediately coupled to the package substrate 204. As an example, the dies 214 may be coupled to the package substrate 204 by a solder preform 216.

As the solder preform 216 is used for coupling the dies 214 to the package substrate 204, the solder preform 216 may have a shape substantially corresponding at least to the die regions. In these embodiments, the stud bumps 202 may be arranged to correspond to an outline of the solder preform 216 (e.g., if the solder preform 216 extends beyond one or more edges of the dies 214) and/or the locations at which the dies 214 will be coupled to the package substrate 204 (e.g., if the dies 214 extend beyond one or more edges of the solder preform 216). The stud bumps 202, therefore, may also be arranged to restrict movement of the solder preform 216.

To further facilitate restriction of movement of the dies 214 and solder preform 216, the solder preform 216 may include one or more notches 218, and one or more of the stud bumps 202 may be disposed within the notches 218. One or more notches 218 may be disposed at least partially between the dies 214, to restrict the dies 214 from moving toward each other.

To effect the coupling of the dies 214 to the package substrate 204 using the solder preform 216, the solder preform 216 may be reflown by application of heat. To avoid the stud bumps 202 melting during the reflown operation, the stud bumps 202 may be comprised of a material having a melting temperature that is higher than a melting temperature of the solder preform 216. Example materials for the stud bumps 202 may include gold, aluminum, copper, or silver. Other materials may be similarly suitable.

The lead frame 208 may provide for electrical access to the dies 214 after the package 200 is encapsulated and/or after a lid (not illustrated) is attached to the package 200. The lead frame 208 may be electrically coupled to the dies 214 by way of wires 220. For clarity, only three wires 220 are illustrated coupling each of the dies 214 to the lead frame 208 and to each other, and only on one side of the dies 214. The package 200 may include more wires 220, and the wires 220 may be disposed along two or more edges of the dies 214.

The stud bumps 202 may be configured such that they each have a profile that is less than a profile of the dies 214 when attached to the package substrate 204. As used herein, "profile" refers to a dimension of the stud bumps 202 or dies 214 perpendicular to the package substrate 204. By limiting the profile of the stud bumps 202, interference with other elements of the package 200 (e.g., the wires 214) may be avoided.

Figure 3:
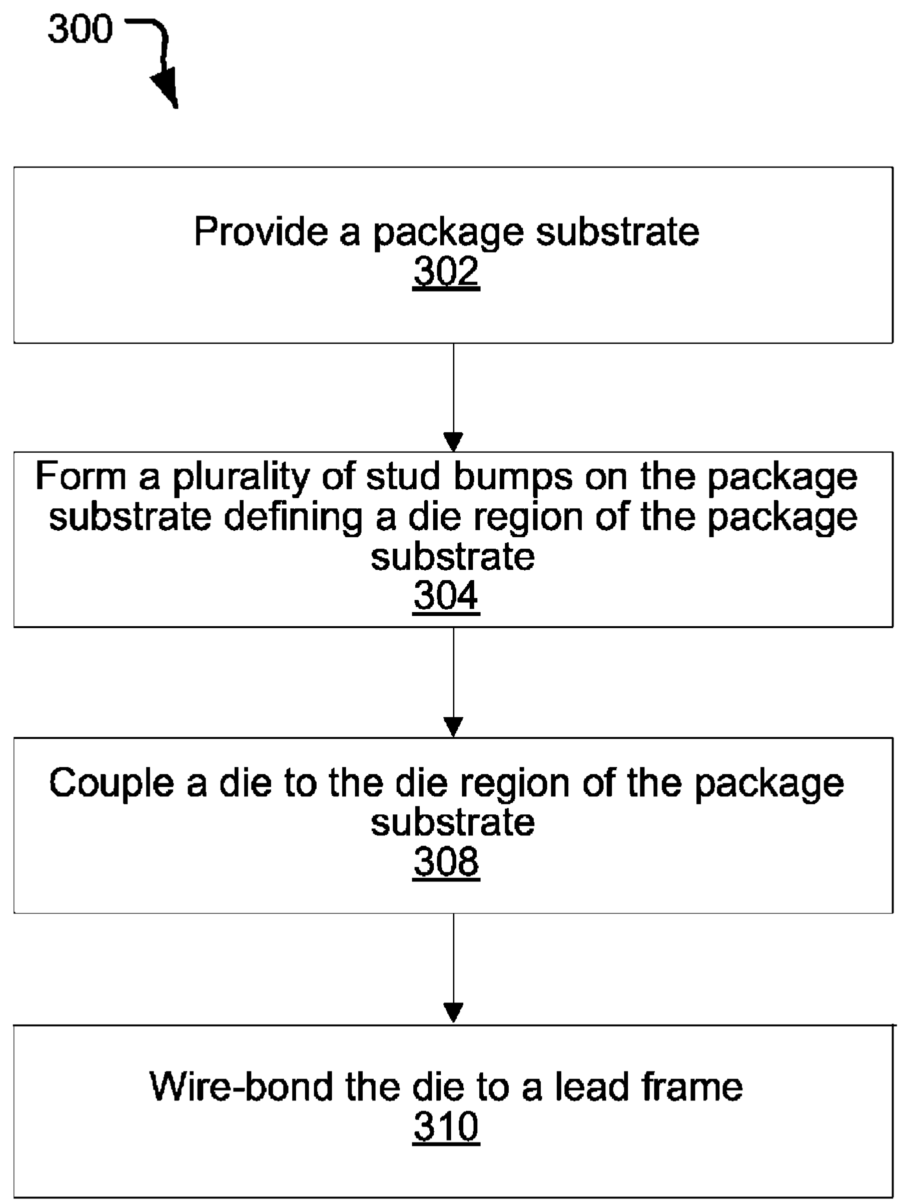
FIG. 3 is a flow diagram of some of the operations associated with making a microelectronic package in accordance with various embodiments.

Turning now to FIG. 3, illustrated is a flow diagram of some of the operations associated with an example method 300 of making a microelectronic package in accordance with various embodiments described herein. It should be noted that although the method is illustrated as a series of sequential steps, the method is not necessarily order dependent. Moreover, methods within the scope of this disclosure may include more or fewer steps than that illustrated in FIG. 3.

At block 302, a package substrate is provided. A plurality of stud bumps may be formed on the package substrate at block 304. As described elsewhere herein, the stud bumps may define a die region of the package substrate in which movement of a die disposed within the die region is restricted prior to attachment of the die to the package substrate, wherein the plurality of stud bumps comprise a profile that is less than a profile of the die when attached to the package substrate.

A die may then be coupled to the package substrate including the stud bumps at block 308. The die may be coupled to the die region of the package substrate in a manner such that the die is bounded by the stud bumps.

Although not illustrated, in various embodiments, the die may be coupled to the package substrate using a solder preform, as described elsewhere herein. In these embodiments, the die may be coupled by disposing a solder preform on the die region of the package substrate, disposing the die or dies, as the case may be, on the solder preform, and then, reflowing the solder preform to couple the die to the die region of the package substrate. During the reflowing, the stud bumps may remain in solid phase or substantially solid phase, so as to substantially remain in fixed locations. Movement of the die may be restricted by the stud bumps during the reflowing.

The method 300 may comprise wire-bonding the die to a lead frame at block 310.

Figure 4:
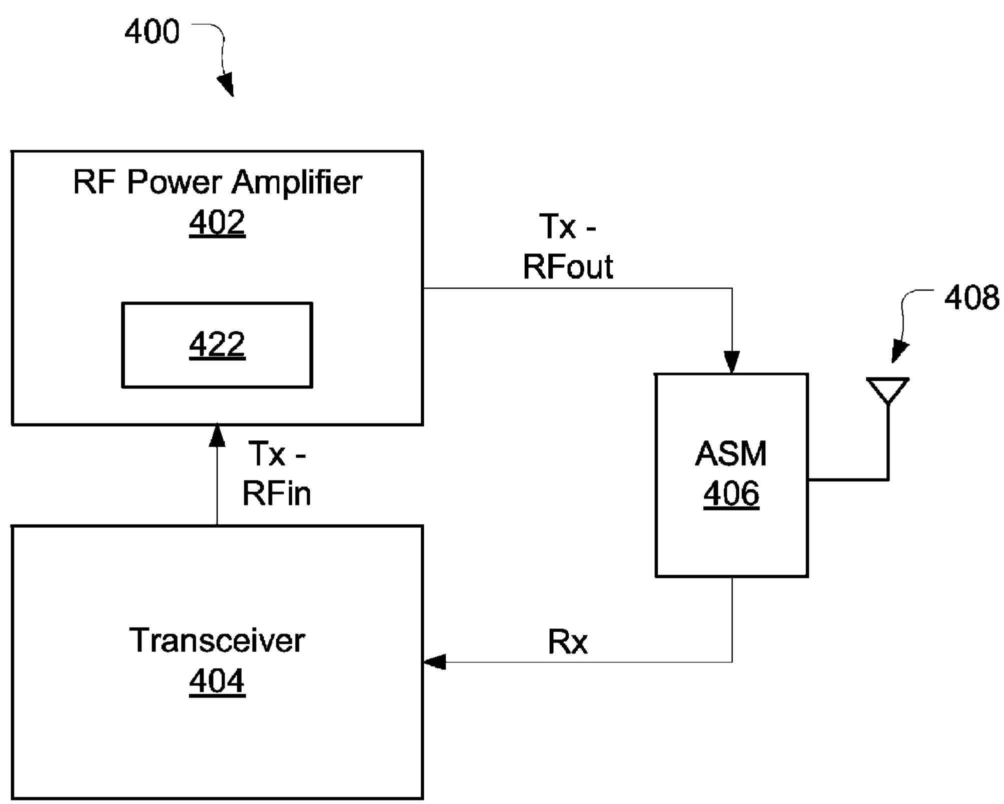
FIG. 4 is a block diagram of a system incorporating a microelectronic package in accordance with various embodiments.

Embodiments of packages including stud bumps described herein may be incorporated into various circuits, apparatuses, and systems. A block diagram of an exemplary system 400 is illustrated in FIG. 4. As illustrated, the system 400 includes an RF power amplifier 402 comprising one or more microelectronic packages 422 including stud bumps for die alignment as described elsewhere herein. The system 400 may include a transceiver 404 coupled with the RF power amplifier 402 as illustrated.

The RF power amplifier 402 may receive an RF input signal, RFin, from the transceiver 404. The RF power amplifier 402 may amplify the RF input signal, RFin, to provide the RF output signal, RFout. The RF input signal, RFin, and the RF output signal, RFout, may both be part of a transmit chain, respectively noted by Tx−RFin and Tx−RFout in FIG. 4.

The amplified RF output signal, RFout, may be provided to an antenna switch module (ASM) 406, which effectuates an over-the-air (OTA) transmission of the RF output signal, RFout, via an antenna structure 408. The ASM 406 may also receive RF signals via the antenna structure 408 and couple the received RF signals, Rx, to the transceiver 404 along a receive chain.

In various embodiments, the antenna structure 408 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 400 may be any system including power amplification. In various embodiments, the system 400 may be particularly useful for power amplification at high radio frequency power and frequency. For example, the system 400 may be suitable for any one or more of terrestrial and satellite communications, radar systems, and possibly in various industrial and medical applications. Radar applications may include military-use radar, air traffic control, navigation, and the like.

In various embodiments, the system 400 may be a selected one of a radar device, a satellite communication device, a mobile handset, a cellular telephone base station, a broadcast radio, or a television amplifier system. The system 400 may find applicability in other applications in which power amplification for high frequency transmission and/or reception is required.

Although the present disclosure has been described in terms of the above-illustrated embodiments, it will be appreciated by those of ordinary skill in the art that a wide variety of alternate and/or equivalent implementations calculated to achieve the same purposes may be substituted for the embodiments shown and described without departing from the scope of the present disclosure. Those with skill in the art will readily appreciate that embodiments in accordance with the present disclosure may be implemented in a very wide variety of embodiments. This description is intended to be regarded as illustrative instead of restrictive.

What is claimed is:

1. An apparatus comprising:

a package substrate; and a plurality of stud bumps coupled to the package substrate and defining a die region of the package substrate in which movement of a die disposed within the die region is restricted prior to attachment of the die to the package substrate, wherein the plurality of stud bumps comprise a profile that is less than a profile of the die when attached to the package substrate, wherein the plurality of stud bumps comprise gold, aluminum, copper, or silver.

2. The apparatus of claim 1, further comprising a solder preform coupling the die to the die region of the package substrate.

3. The apparatus of claim 2, wherein the plurality of stud bumps comprise a material having a melting temperature that is higher than a melting temperature of the solder preform.

4. The apparatus of claim 1, wherein the die region comprises a first die region, wherein the die comprises a first die, and wherein the plurality of stud bumps further define a second die region in which movement of a second die disposed within the second die region is restricted prior to attachment of the second die to the package substrate.

5. The apparatus of claim 4, further comprising a solder preform coupling the first and the second dies to the first and the second die regions, respectively, of the package substrate, and wherein the solder preform includes a notch disposed at least partially between the first and the second dies, and one or more of the stud bumps disposed within the notch.

6. The apparatus of claim 1, further comprising a lead frame coupled to the package substrate, wherein the die is electrically coupled to the lead frame.

7. The apparatus of claim 6, wherein the die is wire-bonded to the lead frame.

8. A method comprising:

providing a package substrate; and forming a plurality of stud bumps on the package substrate defining a die region of the package substrate in which movement of a die disposed within the die region is restricted prior to attachment of the die to the package substrate, wherein the plurality of stud bumps comprise a profile that is less than a profile of the die when attached to the package substrate wherein the die region comprises a first die region, wherein the die comprises a first die, and wherein the plurality of stud bumps further define a second die region in which movement of a second die disposed within the second die region is restricted prior to attachment of the second die to the package substrate.

9. The method of claim 8, further comprising coupling the die to the die region of the package substrate in a manner such that the die is bounded by the plurality of stud bumps, and wherein the coupling comprises coupling the die to the die region of the package substrate using a solder preform.

10. The method of claim 9, wherein the coupling comprises:

disposing the solder preform on the die region of the package substrate;

disposing the die on the solder preform; and reflowing the solder preform to couple the die to the die region of the package substrate.

11. The method of claim 10, wherein during the reflowing, movement of the die is restricted by the plurality of stud bumps.

12. The method of claim 10, wherein during the reflowing, the plurality of stud bumps remain in solid phase.

13. The method of claim 8, further comprising:

disposing a solder preform on the first and the second die regions of the package substrate;

disposing the first and the second dies on the solder preform; and reflowing the solder preform to couple the first and the second dies to the first and second die regions, respectively, of the package substrate.

14. The method of claim 13, wherein the solder preform includes a notch disposed at least partially between the first die and the second die, and one or more of the stud bumps disposed within the notch.

15. The method of claim 8, further comprising wire-bonding the die to a lead frame.

16. A system comprising:

a transceiver to provide a radio frequency (RF) input signal; and a power amplifier coupled to the transceiver to receive the RF input signal from the transceiver and to transmit an RF output signal, the power amplifier including:

a package substrate; and a plurality of stud bumps coupled to the package substrate and defining a die region of the package substrate in which movement of a die disposed within the die region is restricted prior to attachment of the die to the package substrate, wherein the plurality of stud bumps comprise a profile that is less than a profile of the die when attached to the package substrate.

17. The system of claim 16, further comprising an antenna structure coupled to the power amplifier and configured to facilitate transmission of the RF output signal.

18. The system of claim 16, wherein the system is a radar device, a satellite communication device, a mobile handset, a base station, a broadcast radio, or a television amplifier system.

* * * * *